(12) United States Patent
Isohata et al.

(10) Patent No.: US 7,245,076 B2
(45) Date of Patent: Jul. 17, 2007

(54) PLASMA DISPLAY APPARATUS WITH MAIN FRAME AND ADHESIVES HAVING HOLES

(75) Inventors: Hideki Isohata, Kawasaki (JP); Katsuhiro Ishida, Kawasaki (JP); Hideo Kimura, Kawasaki (JP)

(73) Assignee: Fujitsu Hitachi Plasma Display Limited, Kawasaki (JP)

( * ) Notice: Subject to any disclaimer, the term of this patent is extended or adjusted under 35 U.S.C. 154(b) by 24 days.

(21) Appl. No.: 09/995,779

(22) Filed: Nov. 29, 2001

(65) Prior Publication Data
US 2002/0153840 A1 Oct. 24, 2002

(30) Foreign Application Priority Data
Apr. 24, 2001 (JP) ............................... 2001-126411

(51) Int. Cl.
*H01J 17/49* (2006.01)
(52) U.S. Cl. .................. 313/582; 313/493; 313/634
(58) Field of Classification Search ................ 313/582, 313/493, 634, 635; 315/169.3, 169.4
See application file for complete search history.

(56) References Cited

U.S. PATENT DOCUMENTS

| 5,971,566 A | 10/1999 | Tani et al. .................. 362/294 |
| 6,288,489 B1* | 9/2001 | Isohata et al. ............... 313/582 |
| 6,330,148 B1* | 12/2001 | Won et al. .................. 361/681 |

| 2003/0011724 A1* | 1/2003 | Sundahl ....................... 349/73 |

FOREIGN PATENT DOCUMENTS

| EP | 0 821 385 | 1/1998 |
| EP | 0 945 888 | 9/1999 |
| JP | 9-97015 | 4/1997 |
| JP | 10-254372 | 9/1998 |
| JP | 11-065485 | 3/1999 |
| JP | 11-272182 | 10/1999 |
| JP | 2001-11402 | 1/2001 |

OTHER PUBLICATIONS

European Search Report dated Aug. 4, 2005 (in English).

* cited by examiner

*Primary Examiner*—Nimeshkumar D. Patel
*Assistant Examiner*—Kevin Quarterman
(74) *Attorney, Agent, or Firm*—Staas & Halsey LLP

(57) ABSTRACT

A structure, in which the frame can be successfully fixed to the plasma display apparatus at a low cost, has been disclosed. The plasma display apparatus comprises a plasma display panel, circuit substrates having drive circuits to drive the plasma display panel, a main frame to mount the circuit substrates, and adhesive tapes to fix the plasma display panel to the main frame, and small holes are provided on the portion to which the adhesive tapes of the main frame are fixed so that they are arranged regularly at established intervals. When the adhesive tapes and the main frame are fixed, no air bubbles form between the adhesive tapes and the main frame because plural small holes are provided on the portion to which the adhesive tapes of the main frames are fixed.

23 Claims, 7 Drawing Sheets

PLASMA DISPLAY APPARATUS WITH MAIN FRAME AND ADHESIVES HAVING HOLES

BACKGROUND OF THE INVENTION

The present invention relates to a plasma display apparatus that uses a plasma display panel (PDP).

A plasma display panel (referred to as a PDP hereinafter) has recently attracted interest as a display device that can be used as a wall-mounted television, and so on. Since the plasma display apparatus that uses a PDP has been disclosed in, for example, Japanese Unexamined Patent Publication (Kokai) No. 11-272182, a detailed description is omitted here and only the assembly structure of a plasma display apparatus that directly relates to the present invention is described.

FIG. 1 is an exploded perspective view that shows the assembly structure of a plasma display apparatus, FIG. 2 is a perspective view that shows an assembled plasma display apparatus, and FIG. 3 is a partially sectional view of the assembled plasma display apparatus. In the drawings, reference number 1 refers to a PDP, 2 refers to a chip tube to draw off the gases in the PDP, 3 refers to a main frame, 5, 6, and 7 refer to circuit substrates that mount drive circuits, and so on, and 4 and 8 refer to drivers.

The PDP 1 is basically composed of a pair of glass substrates. Because of this, it is difficult to use devices such as screws to directly fix the circuit substrates 5, 6 and 7 onto the PDP 1 and, therefore, another method is employed in which the circuit substrates 5, 6, and 7 are fixed onto the main frame 3 composed of a metal plate, and so on, and then this main frame 3 is bonded and fixed to the PDP 1 with adhesive tape such as a double-sided tape.

The main frame 3 to be bonded to the PDP 1 is required to distribute and radiate the heat generated in the PDP 1 evenly. Because of this, the main frame is composed of materials of a high heat conductivity and is engineered with an increased surface area to provide a better function as a heat sink.

On the other hand, strips of adhesive tape 10 are spaced equally between the main frame 3 and the PDP 1. More concretely, for example, after strips of the adhesive tape 10 are fixed to the entire surface of the PDP 1, side by side, the main frame 3 is fixed, but it is possible the PDP 1 is fixed after the adhesive tapes 10 are fixed to the main frame 3. The adhesive tape 10 is made of materials of a high heat conductivity and serves to transfer the heat generated in the PDP 1 to the main frame 3.

When the adhesive tape 10 is fixed to the PDP 1 or the main frame 3, or when the PDP 1 or the main frame 3 is fixed to the already fixed adhesive tape 10, a problem is caused in that air is enclosed therebetween and air bubbles are prone to form. Air bubbles form an air layer and prevent heat from being transferred and, therefore, it is necessary to remove air bubbles between the adhesive tape 10 and the PDP 1 and between the adhesive tape 10 and the main frame 3 when fixed to each other in order to utilize the heat conductivity of the adhesive tape 10 sufficiently. Therefore, work to draw off the air bubbles was performed in the conventional assembly process. The work to draw off the air bubbles is, however, not easy to carry out and a problem is caused in that the air bubbles are not removed sufficiently and the manufacturing costs are increased.

To solve these problems, Japanese Unexamined Patent Publication (Kokai) No. 10-254372 has disclosed a structure in which recesses and projections are provided on the surface, in contact with the PDP, of the heat conduction sheet interposed between the PDP and the frame chassis (main frame).

The air layers remain not only on the contact surface between the heat conduction sheet and the PDP but also between the heat conduction sheet and the main frame, and both have the same influence on the conduction of heat from the PDP to the main frame. Japanese Unexamined Patent Publication (Kokai) No. 10-254372, however, only refers to elimination of the air layers on the surface, in contact with the plasma display panel, of the heat conduction sheet, not to the air layers on the surface, in contact with the main frame, of the heat conduction sheet. In the invention disclosed in Japanese Unexamined Patent Publication (Kokai) No. 10-254372, air is drawn off through the space between the recesses and the projections during fixing, but the space provided is small and it is actually difficult to draw off air completely through the space.

Moreover, since the PDP 1 is composed of glass substrates, it will be indispensably necessary to ensure strength when the size is enlarged. Because it is difficult to employ the main frame 3 that is intricate and expensive, however, the conventional main frame 3 was composed of a thin metal plate. Therefore, if the circuit substrates 4, 5, 6, 7, and 8 are just mounted onto the main frame 3, a problem is caused in that the strength of the plasma display apparatus is not sufficient. In order to improve the rigidity, it may be necessary, for example, to increase the thickness of the main frame 3 or add reinforcing parts. When increasing the thickness of the main frame 3, however, it is required to increase the degree of flatness of the main frame 3, and a problem, that costs are increased, occurs. In other words, if the main frame 3 is warped, it is adjusted to the PDP 1, and if the main frame 3 is thin, the load to the PDP 1 is small and this does not cause a serious problem. If the main frame 3 is thick, however, the PDP 1 bonded to the warped main frame 3 receives an excessive load, and cracking of the panel may occur.

It is preferable that the surface area of the main frame 3 is large enough to increase the heat radiation efficiency. Therefore, a large heat sink with a large surface area is conventionally used as a reinforcing part, but this causes a problem in that the cost of the reinforcing parts is increased.

SUMMARY OF THE INVENTION

The object of the present invention is to solve the above-mentioned problems and provide a plasma display apparatus having a frame structure with which various problems can be solved without an increase in the cost.

The present invention relates to a plasma display apparatus comprising a plasma display panel, circuit substrates having drive circuits to drive the plasma display panel, a main frame to mount these circuit substrates, and adhesive tapes to fix the plasma display panel to the main frame in place. To realize the above-mentioned object, plural small holes are provided, where the adhesive tape of the main frame is fixed, in the first embodiment of the present invention. It is preferable that these small holes are arranged regularly at established intervals.

According to the first aspect, no air bubble is formed between the adhesive tape and the main frame because plural small holes are provided where the adhesive tape of the main frame is fixed and air between the adhesive tape and the main frame passes to the outside through these small holes, when the adhesive tape and the main frame are fixed together. If air bubbles are formed, they can be easily drawn off through the small holes.

It is obvious that there is no heat conduction where a small hole is provided because no metal plate of the main frame exists where the small holes are. Therefore, the heat conductivity becomes lower compared to the case where no small hole is provided and no air bubble exists, but at least the state in which air bubbles exist locally can easily be avoided. In the conventional case where no small hole is provided, a state in which large continuous air bubbles exist throughout a wide area used to occur frequently. The present applicants have investigated and found that small air bubbles cause few problems and what matters actually is the occurrence of large continuous air bubbles throughout a wide area, and a problem is caused when these large air bubbles lower the heat conductivity in a continuous wide area. Therefore, no problem is caused even if no heat conduction is carried out at small holes. In particular, if plural small holes are arranged regularly at established intervals, the formation of large air bubbles can be avoided.

According to the second aspect of the present invention, plural small recesses are provided on the surface of the main frame to which the adhesive tape is fixed. These plural small recesses have a circular or another shape and are formed by recess engineering, and it is preferable that these are arranged regularly at established intervals.

According to the second aspect of the present invention, it is impossible to draw off the air bubbles generated between the main frame and the adhesive tape, different to the case in the first aspect, but the occurrence of air bubbles in a portion other than the recesses can be avoided. Therefore, the occurrence of the large continuous air bubbles throughout a wide area can be prevented and no problem is caused even if heat conduction is not carried out in the recesses.

The second aspect can be applied easily even if the plate thickness of the main frame is increased because it is not required to drill a hole in the main frame and the recesses can be engineered by simple press working without degrading the rigidity of the main frame.

According to the third aspect of the present invention, in addition to either one of or both the first and the second aspects, plural recesses or projections are provided on the surface opposite to the one to which the adhesive tape of the main frame is fixed (that is, the surface to which circuit substrates are mounted). It is preferable that these plural small recesses or projections are arranged regularly at established intervals.

According to the third aspect of the present invention, the heat radiation efficiency of the main frame is improved because the surface area of the side where heat radiation is carried out is increased. Moreover, by applying the recess and projection working to both the sides, the rigidity of the main frame can be improved at the same time.

Each or every one of the above-mentioned first through third aspects can be combined. By combining these aspects, it is possible to positively draw off air bubbles or prevent air bubbles from forming and, at the same time, to improve the rigidity of the plate materials. Moreover, the combination of these embodiments does not require any additional press working, therefore, the heat conductivity, heat radiation efficiency, and rigidity can be improved at a low cost.

The above-mentioned first through third aspects can be combined with the structure disclosed in Japanese Unexamined Patent Publication (Kokai) No. 10-254372.

According to the fourth aspect of the present invention, plural small holes are provided in the adhesive tape. It is preferable that these plural small holes are arranged regularly at established intervals.

According to the fourth aspect of the present invention, when the adhesive tape is fixed first to the PDP or the main frame, air bubbles are not formed because air leaks out from the small holes. When the PDP or the main frame is fixed to the adhesive tape already fixed to the main frame or the PDP, air bubbles can be prevented from forming in any portion other than the holes of the adhesive tape. Particularly when the fourth and the first aspects are combined, it is possible to draw off air during pasting if the positions of the plural small holes of the adhesive tape are aligned with those of the small holes of the main frame.

According to the fifth aspect of the present invention, plural small recesses are provided on both the surface of the adhesive tape in contact with the plasma display panel and the surface in contact with the main frame. It is preferable that these plural small recesses are arranged regularly at established intervals.

According to the fifth aspects, air bubbles can be prevented from forming in any portion other than the recesses of the adhesive tape when the adhesive tape is fixed to both the PDP and the main frame, because the plural small recesses are provided on both the sides of the adhesive tape.

BRIEF DESCRIPTION OF THE DRAWINGS

The features and advantages of the invention will be more clearly understood from the following description taken in conjunction with the accompanying drawings, in which.

DESCRIPTION OF THE PREFERRED EMBODIMENTS

Figure 1:
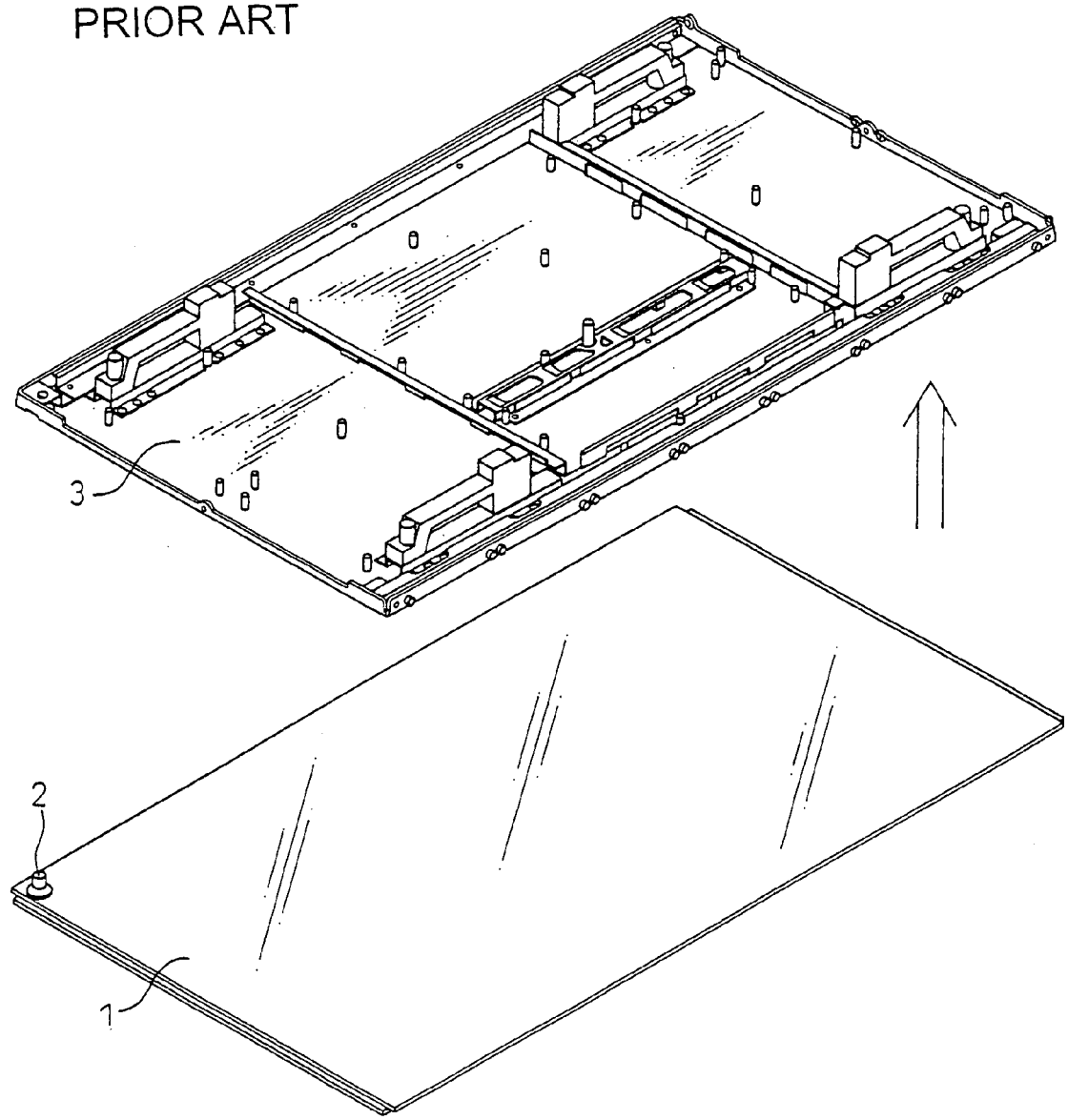
FIG. 1 is a diagram that shows the assembly structure of the plasma display apparatus.
Figure 2:
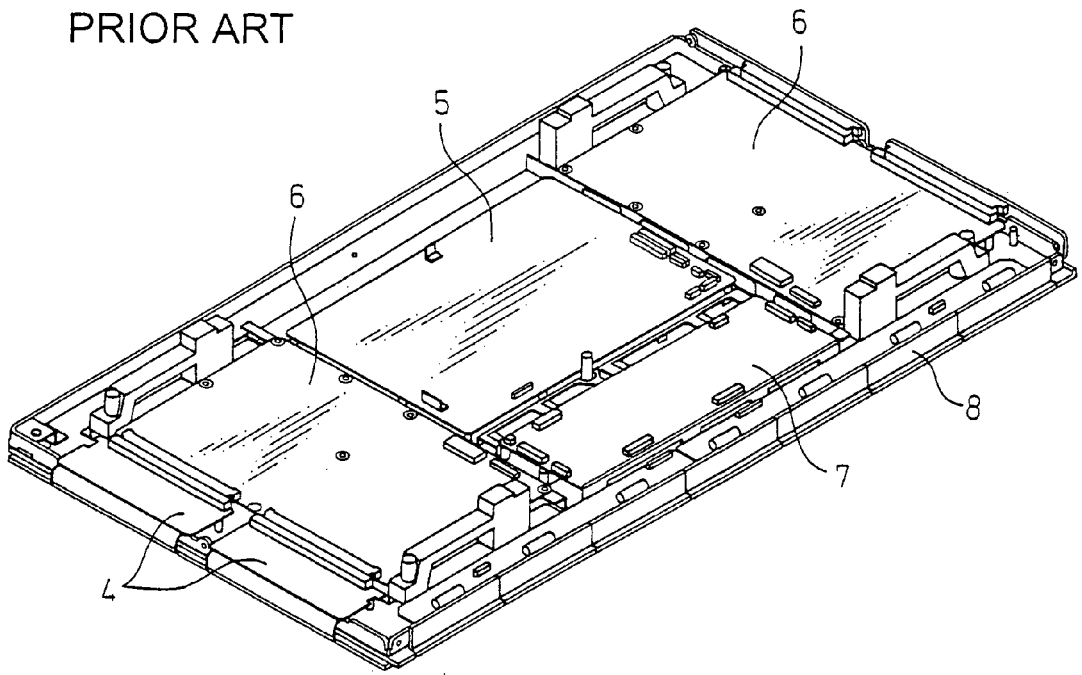
FIG. 2 is a perspective view of the plasma display apparatus.
Figure 3:
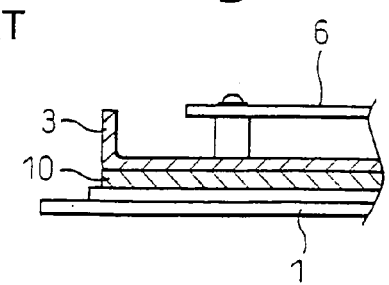
FIG. 3 is a partially sectional view of the conventional example.

The embodiments of the present invention are described below with reference to FIG. 4 through FIG. 15. The plasma display apparatus to which the present invention is applied has a structure similar to that shown in FIG. 1 through FIG. 3, and only the main frame 3 and the adhesive tape 10 are different.

Figure 4:
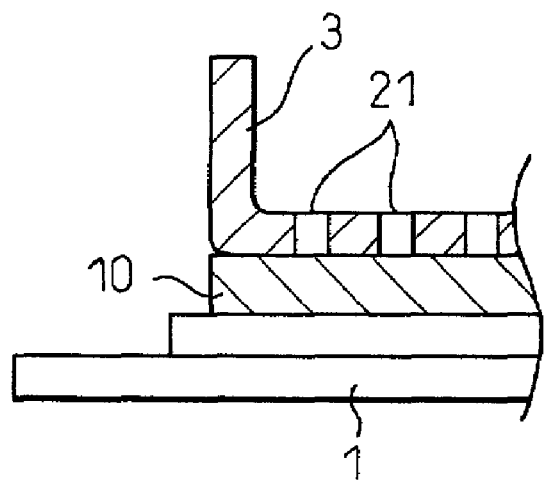
FIG. 4 through FIG. 15 are partially sectional views of the structure in the embodiments of the present invention.

FIG. 4 is a partially sectional view of the structure in the first embodiment. As shown schematically, in the first embodiment, plural small holes 21 are arranged regularly at established intervals on the side of the main frame 3 to which the adhesive tape 10 is fixed. When the adhesive tape 10 and the main frame 3 are fixed to each other, no air bubble is formed between the adhesive tape 10 and the main frame 3 because the air between the adhesive tape 10 and the main frame 3 leaks out through the small holes 21. Even if air bubbles are formed, they can be drawn off easily with the help of the small holes 21.

Figure 5:
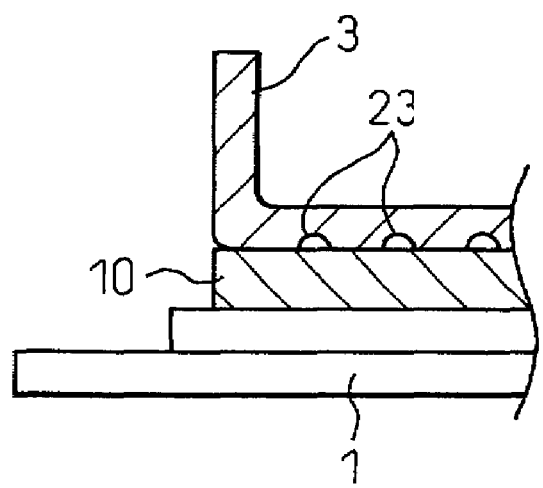

FIG. 5 is a partially sectional view of the structure in the second embodiment. As shown schematically, plural small recesses are arranged regularly at established intervals on the surface of the main frame 3 to which the adhesive tape 10 is fixed. Although it is impossible to draw off air bubbles formed between the main frame 3 and the adhesive tape 10, air bubbles can be prevented from forming in any portion other than the recesses 23. Therefore, the occurrence of continuous large air bubbles throughout a wide area can be avoided. In other words, in the second embodiment, rather than drawing off air bubbles completely, the occurrence of continuous large air bubbles throughout a wide range is positively controlled by forming small air bubbles regularly corresponding to the recesses 23. The second embodiment can be applied easily even if the plate thickness of the main frame is increased because it is not required to drill a hole in the main frame and the recesses can be engineered by a simple press working without degrading the rigidity of the main frame.

Figure 6:
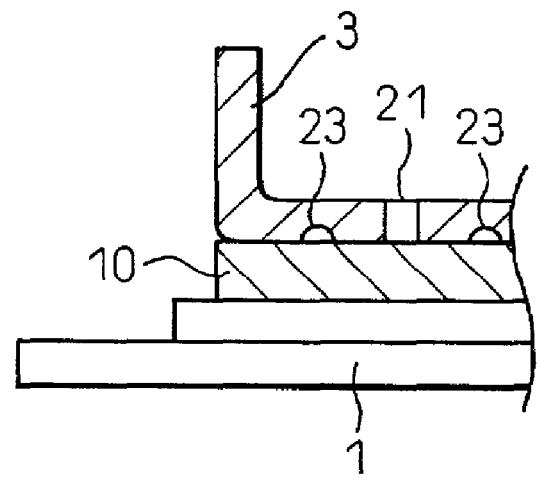

FIG. 6 is a partially sectional view of the structure in the third embodiment, which is a combination of the structure in the first embodiment and that in the second embodiment. As shown schematically, the plural small holes 21 and plural small recesses 23 are arranged regularly at established intervals on the surface of the main frame 3 to which the adhesive tape 10 is fixed. Therefore, in this embodiment, while the rigidity of the plate materials is maintained, air bubbles can be positively drawn off, resulting in an improvement in rigidity and in heat conductivity.

Figure 7:
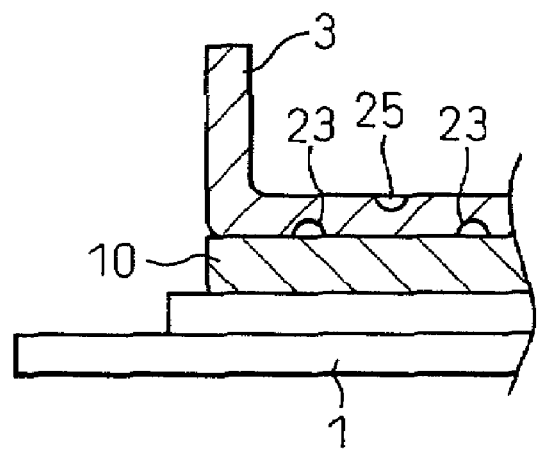

FIG. 7 is a partially sectional view of the structure in the fourth embodiment. As shown schematically, in the fourth embodiment, recess working is performed not only on the side of the main frame 3 with which the adhesive tape 10 is in contact, but also on the side to which circuit substrates are attached. By performing the recess working (i.e., recess 25) also on the side to which circuit substrates are attached, the surface area from which heat is radiated is increased and the heat radiation efficiency of the main frame 3 is improved. Moreover, the rigidity of the main frame 3 is also improved because the recess working is performed on both sides.

Figure 8:
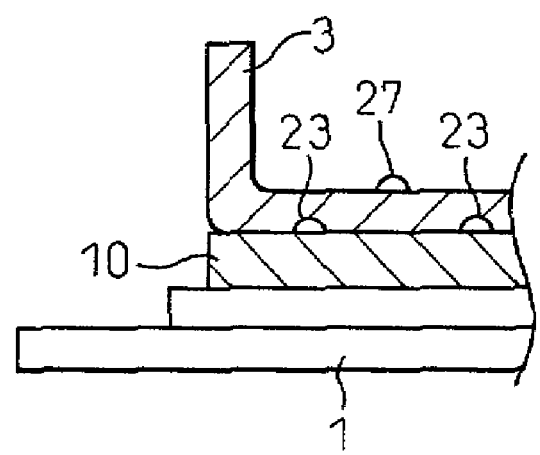

FIG. 8 is a partially sectional view of the structure in the fifth embodiment. As shown schematically, in the fifth embodiment, projection working (i.e., projection 27) is performed instead of the recess working in the fourth embodiment on the side to which circuit substrates are attached, and the same effect as that in the fourth embodiment can be attained.

Figure 9:
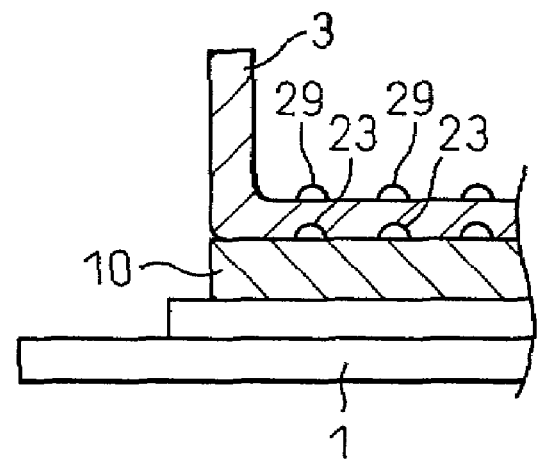

FIG. 9 is a partially sectional view of the structure in the sixth embodiment, in which recess working (i.e., recesses 23) and projection working (i.e., projections 29) in the fifth embodiment is performed to the same positions on both sides of the main frame 3. In this embodiment, the recess working and the protrusion working can be performed simultaneously with the press working.

Figure 10:
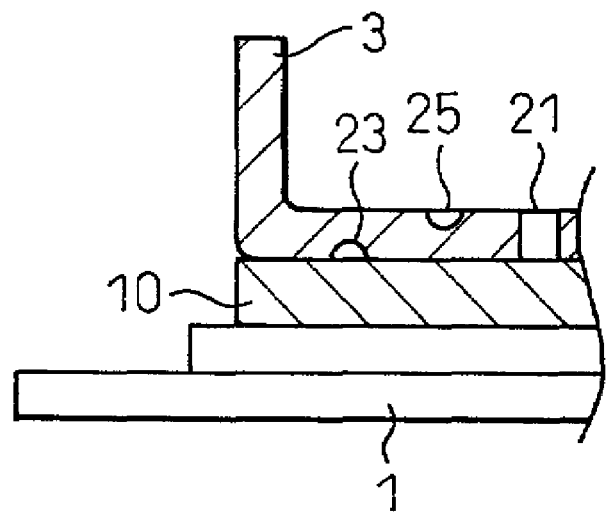
Figure 11:
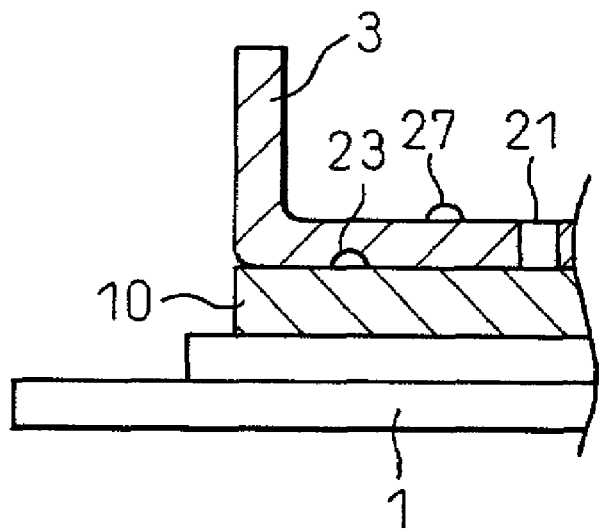

FIG. 10 is a partially sectional view of the structure in the seventh embodiment, which is the combination of the structure in the first embodiment and that in the fourth embodiment, and FIG. 11 is a partially sectional view of the structure in the eighth embodiment, which is the combination of the structure in the first embodiment and that in the fifth embodiment. In the structures in FIG. 10 and FIG. 11, in addition to the summed effect of each one, the heat conductivity, the heat radiation efficiency, and the rigidity can be improved at a low cost because press working is not required even if the structures are combined.

Figure 12:
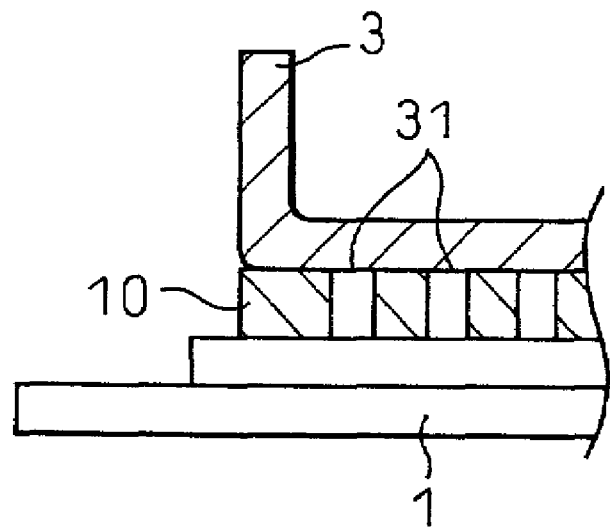

FIG. 12 is a partially sectional view of the structure in the ninth embodiment. As shown schematically, in the ninth embodiment, plural small holes 31 are arranged regularly at established intervals in the adhesive tape 10. When the adhesive tape 10 is first fixed to the PDP 1, no air bubble forms between the adhesive tape 10 and the PDP 1 because the air between the adhesive tape 10 and the PDP 1 is drawn off to the outside through these small holes 31. If air bubbles form, it is easy to draw them off by utilizing the small holes 31. Next, when the adhesive tape 10 fixed to the PDP 1 is fixed to the main frame 3, no air bubble forms in any portion other than the small holes 31 between the adhesive tape 10 and the main frame 3 because of the small holes 31.

On the contrary, when the adhesive tape 10 is first fixed to the main frame 3, no air bubble forms between the adhesive tape 10 and the main frame 3 because the air between the adhesive tape 10 and the main frame 3 is drawn off to the outside through the small holes 31. If air bubbles form, it is easy to draw them off by utilizing the small holes 31. Next, when the adhesive tape 10 fixed to the main frame 3 is fixed to the PDP 1, no air bubbles form in any portion other than the small holes 31 between the adhesive tape 10 and the main frame 3 because of the small holes 31.

Figure 13:
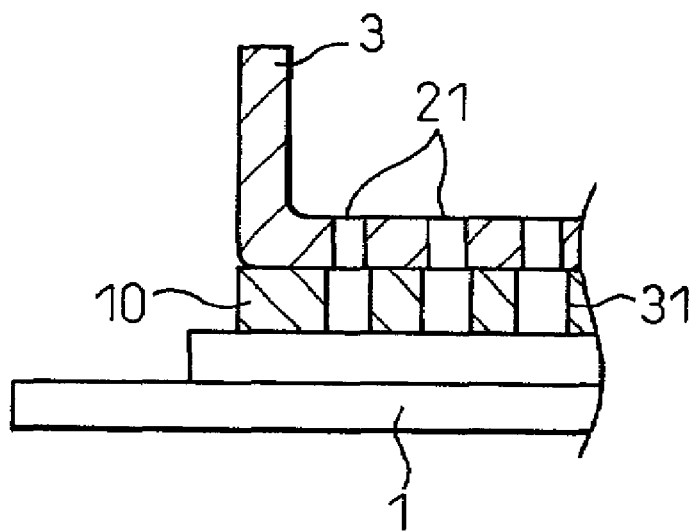

FIG. 13 is a partially sectional view of the structure in the tenth embodiment, which is the combination of the structure in the first embodiment and that in the ninth embodiment. As shown schematically, the small holes 21 provided in the main frame 3 and the small holes provided in the PDP 1 are arranged regularly at established intervals so that the positions are aligned. Therefore, when the adhesive tape 10 fixed to the PDP 1 or the main frame 3 is fixed to the main frame 3 or the PDP 1, no air bubbles form because the air between them is drawn off to the outside through the small holes 21 and the small holes 31.

Figure 14:
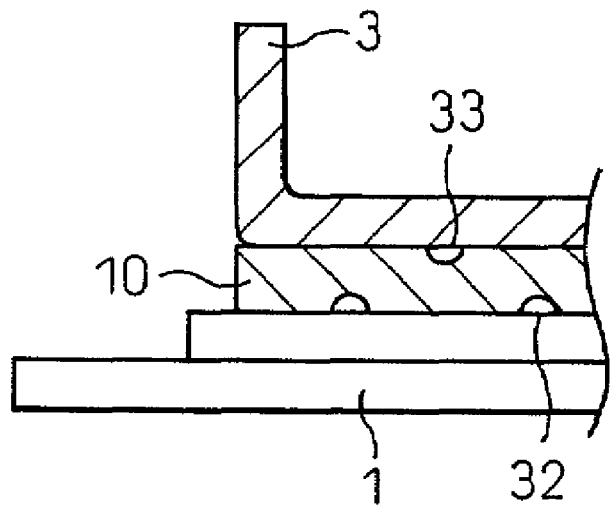

FIG. 14 is a partially sectional view of the structure in the eleventh embodiment. As shown schematically, in the eleventh embodiment, plural small recesses 32 and 33 are arranged regularly at established intervals in both sides of the adhesive tape 10. When the adhesive tape 10 is fixed to the PDP 1 or the main frame 3, no air bubbles form in any portion other than the small recesses 32 and 33 between the adhesive tape 10 and the PDP 1 or between the adhesive tape 10 and the main frame 3 because of the small recesses 32 and 33.

Figure 15:
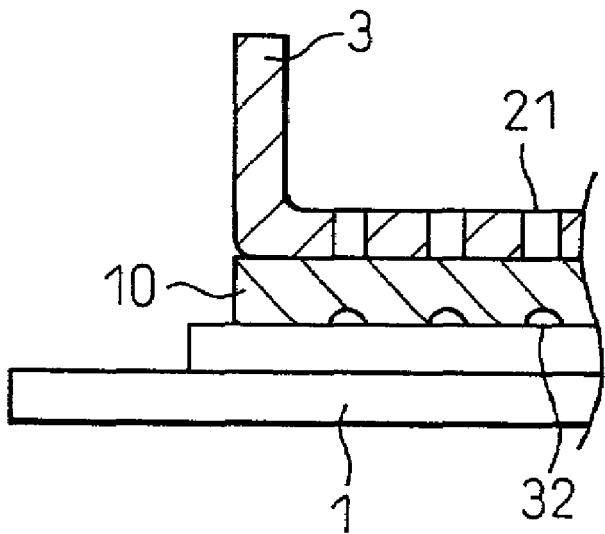

FIG. 15 is a partially sectional view of the structure in the twelfth embodiment. As shown schematically, in the twelfth embodiment, the plural small recesses 32 are arranged regularly at established intervals on the surface of the adhesive tape 10, which is in contact with the PDP 1, and at the same time, the plural small holes 21 are arranged regularly at established intervals through the main frame 3. When the adhesive tape 10 is fixed to the main frame 3, no air bubbles form between the adhesive tape 10 and the main frame 3 because the air between the adhesive tape 10 and the main frame 3 is drawn off to the outside through the small holes 21. When the adhesive tape 10 is fixed to the PDP 1, no air bubbles form in any portion other than the recesses 32 between the adhesive tape 10 and the PDP 1 because of the existence of the recesses 32.

The embodiments of the present invention are described as above, and it is possible to arrange various combinations of each embodiment and there can be various modifications. For example, by combining the structure in the fourth embodiment and that in the eleventh embodiment, it is possible to arrange plural small recesses regularly at established intervals on both sides of the adhesive tape 10 and to simultaneously arrange plural small holes regularly at established intervals through the main frame 3.

As described above, in the plasma display apparatus of the present invention, the heat conductivity, the heat radiation efficiency, and the rigidity can be improved without a considerable increase in cost, because plural small holes or small recesses, which draw off air bubbles generated during pasting, are provided between the main frame to be fixed to the plasma display and the adhesive tape.

We claim:

1. A plasma display apparatus comprising a plasma display panel, circuit substrates having drive circuits to drive said plasma display panel, a main frame to mount said circuit substrates, and adhesive tapes to fix said plasma display panel directly to said main frame, wherein said main frame comprises plural holes arranged regularly at established intervals on the portion where said adhesive tapes contact the main frame and are fixed, and said holes form a passage for drawing air from the surface between said adhesive tapes and said main frame.

2. A plasma display apparatus as set forth in claim 1, wherein said main frame comprises plural small recesses on the portion, to which said adhesive tapes are fixed, of the surface to which said adhesive tapes are fixed.

3. A plasma display apparatus as set forth in claim 2, wherein said plural small recesses are arranged regularly at established intervals.

4. A plasma display apparatus as set forth in claim 1, wherein said main frame comprises plural small recesses provided on the surface opposite to the one to which said adhesive tapes are fixed.

5. A plasma display apparatus as set forth in claim 4, wherein said plural small recesses, provided on the surface opposite to one to which said adhesive tapes are fixed, are arranged regularly at established intervals.

6. A plasma display apparatus as set forth in claim 1, wherein said main frame comprises plural small projections on the surface opposite to one to which said adhesive tapes are fixed.

7. A plasma display apparatus as set forth in claim 6, wherein said plural small projections are arranged regularly at established intervals.

8. A plasma display apparatus as set forth in claim 1, wherein said adhesive tapes comprise plural small holes.

9. A plasma display apparatus as set forth in claim 8, wherein said plural small holes of the adhesive tapes are arranged regularly at established intervals.

10. A plasma display apparatus as set forth in claim 1, wherein said adhesive tapes comprise plural small recesses on the surface in contact with said plasma display panel.

11. A plasma display apparatus as set forth in claim 10, wherein said plural small recesses on said adhesive tapes are arranged regularly at established intervals.

12. A plasma display apparatus comprising a plasma display panel, circuit substrates having drive circuits to drive said plasma display panel, a main frame to mount said circuit substrates, and adhesive tapes to fix said plasma display panel directly to said main frame, wherein said main frame comprises plural recesses arranged regularly at established intervals on the portion, to which said adhesive tapes are fixed, of the surface to which said adhesive tapes contact the main frame and are fixed, and said recesses have cavities between said adhesive tapes and said main frame, and form air bubbles in the cavities.

13. A plasma display apparatus as set forth in claim 12, wherein said main frame comprises plural small recesses on the surface opposite to the one to which said adhesive tapes are fixed.

14. A plasma display apparatus as set forth in claim 13, wherein said plural small recesses, provided on the surface opposite to one to which said adhesive tapes are fixed, are arranged regularly at established intervals.

15. A plasma display apparatus as set forth in claim 12, wherein said main frame comprises plural small projections provided on the surface opposite to the one to which said adhesive tapes are fixed.

16. A plasma display apparatus as set forth in claim 15, wherein said plural small projections are arranged regularly at established intervals.

17. A plasma display apparatus as set forth in claim 12, wherein said adhesive tapes comprise plural small holes.

18. A plasma display apparatus as set forth in claim 17, wherein said plural small holes are arranged regularly at established intervals.

19. A plasma display apparatus as set forth in claim 12, wherein said adhesive tapes comprise plural small recesses on the surface in contact with said plasma display panel.

20. A plasma display apparatus as set forth in claim 19, wherein said plural small recesses on said adhesive tapes are arranged regularly at established intervals.

21. A plasma display apparatus comprising a plasma display panel, circuit substrates having drive circuits to drive said plasma display panel, a main frame to mount said circuit substrates, and adhesive tapes to attach said plasma display panel directly to said main frame, wherein, said adhesive tapes comprise plural holes arranged regularly at established intervals on said adhesive tapes, and said holes form air bubbles in the holes between said plasma display panel and said main frame.

22. A plasma display apparatus comprising a plasma display panel, circuit substrates having drive circuits to drive said plasma display panel, a main frame to mount said circuit substrates, and adhesive tapes to attach said plasma display panel directly to said main frame, wherein said adhesive tapes comprise plural recesses arranged regularly at established intervals on at least one of the surface in contact with said plasma display panel or that are in contact with said main frame, and said recesses have cavities between said adhesive tapes and said main frame or said adhesive tapes and said plasma display panel, and form air bubbles in the cavities.

23. A plasma display apparatus comprising:
a plasma display panel;
a main frame having plural small holes;
circuit substrates having drive circuits and being mounted on the main frame; and
adhesive tapes placed over the plural small holes, contacting and affixing the main frame directly to the plasma display panel,
wherein said plural holes are arranged regularly at established intervals on a portion where said adhesive tapes contact the main frame and are fixed, and said holes form a passage for drawing air from the surface between said adhesive tapes and said main frame.

* * * * *

UNITED STATES PATENT AND TRADEMARK OFFICE
CERTIFICATE OF CORRECTION

| | | |
|---|---|---|
| PATENT NO. | : 7,245,076 B2 | Page 1 of 1 |
| APPLICATION NO. | : 09/995779 | |
| DATED | : July 17, 2007 | |
| INVENTOR(S) | : Hideki Isohata et al. | |

It is certified that error appears in the above-identified patent and that said Letters Patent is hereby corrected as shown below:

Column 8, Line 27, after "wherein" delete ",".

Signed and Sealed this

Twentieth Day of November, 2007

JON W. DUDAS
*Director of the United States Patent and Trademark Office*